United States Patent
Oh et al.

(10) Patent No.: US 6,304,994 B1
(45) Date of Patent: Oct. 16, 2001

(54) REED SOLOMON DECODER AND DECODING METHOD UTILIZING A CONTROL SIGNAL INDICATING A NEW ROOT FOR AN INITIAL ERROR LOCATOR POLYNOMIAL WITH RESPECT TO NEW ERASURE INFORMATION

(75) Inventors: Ji-sung Oh, Sungnam; Kyu-taeg Oh, Seoul, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/154,828

(22) Filed: Sep. 17, 1998

(30) Foreign Application Priority Data

Sep. 25, 1997 (KR) .................................. 97-48837

(51) Int. Cl.[7] .................................................. H03M 13/00
(52) U.S. Cl. .......................................... 714/784; 714/785
(58) Field of Search .................................. 714/704, 784, 714/785; 712/228

(56) References Cited

U.S. PATENT DOCUMENTS

| | | | |
|---|---|---|---|
| 4,649,541 | 3/1987 | Lahmeyer | 714/752 |
| 4,868,828 | * 9/1989 | Shao et al. | 714/704 |
| 5,130,990 | * 7/1992 | Hsu et al. | 714/784 |
| 5,951,677 | * 9/1999 | Wolf et al. | 712/228 |

OTHER PUBLICATIONS

Truong et al., "Simplified Procedure for Correcting both Errors and Erasures of Reed–Solomon Code Using Euclidean Algorithm", Nov. 1988 IEE proceedings pp. 318–324.*

Shao et al., "A Systolic VLSI Design of a Pipeline Reed-Solomon Decoder", Oct. 1983 pp. 99–113.*

Oh et al., "An Efficient Reed–Solomon Decoder VLSI with Erasure Correction", May 1997 IEEE pp. 193–201.*

Kwon et al., "An Area–Efficient VLSI Architechture of a Reed–Solomon Decorder/Encoder for Digital VCRs", Jun. 1997 IEEE pp. 1019–1027.*

H.M. Shao, I.S Reed, "On the VLSI Design of a Pipeline Reed–Solomon Decoder Using Systolic Arrays" vol. 37, No. 10, Oct. 1988.

Youshi Xu, "A Modified Euclidean Algorithm and the VLSI Implementation" publication date May 13, 1996.

* cited by examiner

Primary Examiner—David Ton
(74) Attorney, Agent, or Firm—Sughrue, Mion, Zinn, Macpeak & Seas, PLLC

(57) ABSTRACT

A Reed-Solomon (RS) decoder and a decoding method therefor are provided. The RS decoder includes a polynomial calculator for calculating syndrome values from received data and constructing a syndrome polynomial, a generator for generating a root for an initial error locator polynomial from erasure information of the received data and a control signal showing a new root for the initial error locator polynomial whenever new erasure information is input, a first polynomial expander having a serial expansion architecture, for expanding the initial error locator polynomial using the root and control signal for the initial error locator polynomial and providing the result to the processor, and a second polynomial expander having a serial expansion architecture, for expanding a modified syndrome polynomial using the syndrome value, and the root and control signal for the initial error locator polynomial and providing the result to the processor. According to the present invention, it is possible to simplify the circuit structure of the RS decoder by minimizing the number of multipliers required for calculating the polynomial.

16 Claims, 4 Drawing Sheets

US 6,304,994 B1

REED SOLOMON DECODER AND DECODING METHOD UTILIZING A CONTROL SIGNAL INDICATING A NEW ROOT FOR AN INITIAL ERROR LOCATOR POLYNOMIAL WITH RESPECT TO NEW ERASURE INFORMATION

BACKGROUND OF THE INVENTION

1. Field of the Invention

The present invention relates to an error correction decoding field, and more particularly, to a Reed-Solomon (RS) decoder and a decoding method.

2. Description of the Related Art

An RS decoder is mainly used for correcting errors generated during transmission in a digital communications system using a high definition television (HDTV), a digital versatile disc (DVD), or a compact disc (CD), and has excellent error correcting performance. However, the RS decoder has a very complicated structure. In general, an RS code is expressed as RS(N,I). One packet is comprised of N symbols. Among these symbols, I symbols show a message. The remaining N-I symbols show a parity. Each symbol is comprised of m bits.

FIG. 1 is a block diagram of a conventional RS decoder using a modified Euclidean algorithm, which is described in the document [1]: "On the VLSI Design of a Pipeline Reed-Solomon Decoder Using Systolic Arrays", H. M. Shao and I. S. Reed, IEEE Trans. Comput, vol. 37, October. 1988, pp. 1273–1280.

The conventional polynomial expansion of two parts, a first polynomial expander 106 expands an initial error locator polynomial using the root $\alpha^{-k}$ of the initial error locator polynomial on erasure information previously stored in an $\alpha^{-k}$ generator 102. A second polynomial expander 108 expands a modified syndrome polynomial using the syndrome polynomial calculated by a first polynomial calculator 104. The coefficients of the syndrome polynomial becomes each calculated syndrome value. Also, an erasure means an error in which the location is known from received data. An error means an error, the location and magnitude of which are known.

In the parallel expansion method provided in the document [1], when the number of errors capable of being corrected is t, since the first polynomial expander 106 must calculate 2t+1 coefficients because the initial error locator polynomial has 2t degrees, 2t+1 registers of m-bit(8-bit) must exist as shown in FIG. 2. Also, 2t+1 multipliers and 2t+1 adders are necessary for expanding the initial error locator polynomial.

Since the second polynomial expander 108 for generating the modified syndrome polynomial must calculate 2t coefficients because the modified syndrome polynomial has 2t–1 degrees, 2t registers, 2t multipliers, and 2t adders for calculating and storing the 2t coefficients are necessary as shown in FIG. 3. A previously calculated syndrome is provided to each register as an initial value. The operation of the iterative equation shown in Equation 7 is performed with respect to the syndrome input according to a clock signal (CLK). Accordingly, the respective coefficients of the modified syndrome polynomial are obtained after a clock time of 2t.

Therefore, in the RS decoder employing a conventional parallel expansion method, the number of multipliers required for calculating the polynomial is the sum of the multipliers used during calculating the modified syndrome polynomial and the initial error locator polynomial, i.e., 2t+2t+1(=4t+1).

Since the operation used in the RS decoder is performed on the Galois Field, the multiplier is not a general decimal multiplier but a Galois field multiplier. Accordingly, the structure of the Galois field multiplier becomes more complicated. Since the Galois Field multiplier requires largest number of gates in realizing an integrated circuit of the RS decoder, the complexity remarkably increases as the number (t) of errors capable of being corrected increases in order to calculate the polynomial by the parallel expansion method.

SUMMARY OF THE INVENTION

To solve the above problems, it is an objective of the present invention to provide an RS decoder using a minimum number of multipliers regardless of the number of errors capable of being corrected in calculating a polynomial using a modified Euclidean algorithm.

It is another objective of the present invention to provide an RS decoding method using serial expansion in calculating a polynomial using a modified Euclidean algorithm.

Accordingly, to achieve the first objective, there is provided a Reed-Solomon (RS) decoder including a modified Euclidean algorithm processor for searching the location and size of an error based on syndrome values, comprising a polynomial calculator for calculating syndrome values from received data and constructing a syndrome polynomial, a generator for generating a root for an initial error locator polynomial from erasure information of the received data and a control signal showing a new root for the initial error locator polynomial whenever new erasure information is input, a first polynomial expander having a serial expansion architecture, for expanding the initial error locator polynomial using the root and control signal for the initial error locator polynomial and providing the result to the processor, and a second polynomial expander having a serial expansion architecture, for expanding a modified syndrome polynomial using the syndrome value, and the root and control signal for the initial error locator polynomial and providing the result to the processor.

To achieve the second objective, there is provided an RS decoding method using a modified Euclidean algorithm, comprising the steps of (a) calculating skis syndrome values from received data, (b) generating a root for an initial error locator polynomial from the erasure information of the received data and a control signal showing a new root for the initial error locator polynomial with respect to new erasure information, (c) expanding an initial error locator polynomial using the root for the initial error locator polynomial and the control signal, (d) expanding a modified syndrome polynomial using the syndrome value, the root for the initial error locator polynomial, and the control signal, and (e) calculating the location and size of the error included in the received data using the modified Euclidean algorithm using the expanded initial error locator polynomial and the modified syndrome polynomial.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 4:
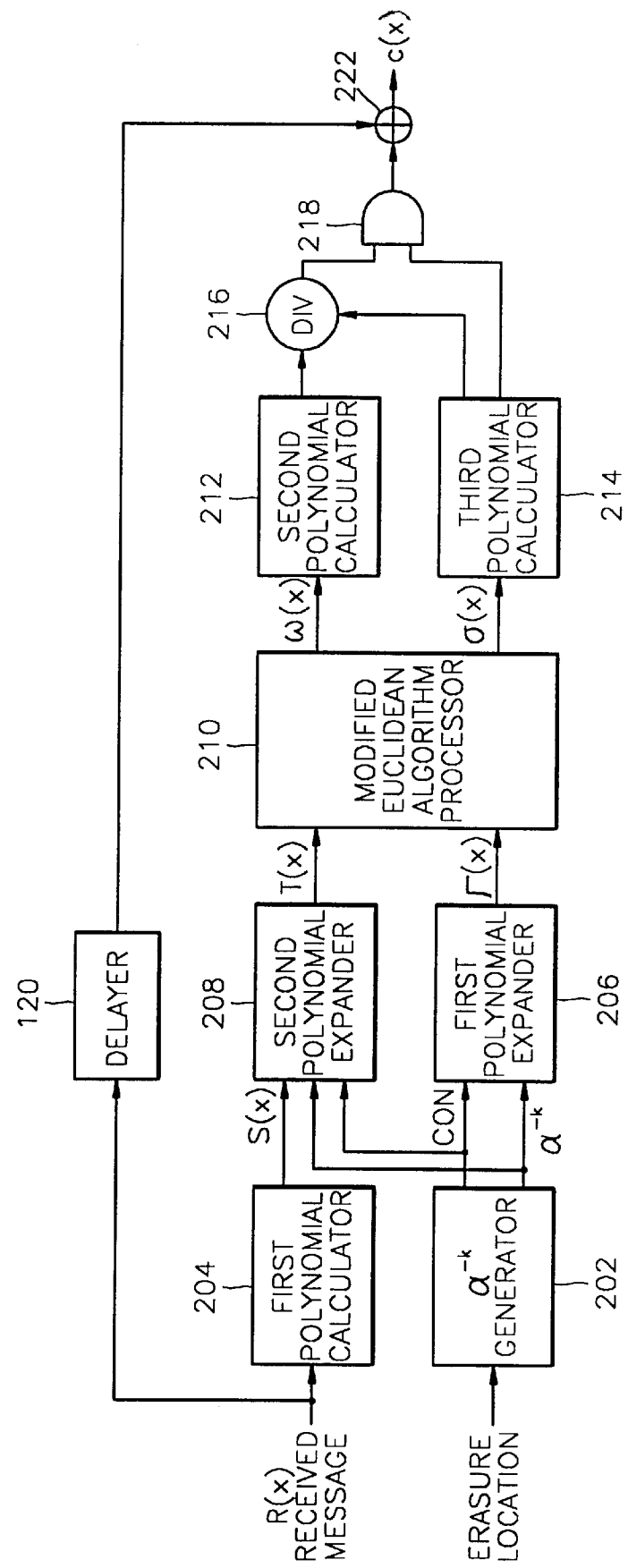
FIG. 4 is a block diagram according to an embodiment of an RS decoder of the present invention.

In FIG. 4, which shows a block diagram of the RS decoder according to the present invention, when an $\alpha^{-k}$ generator 202 generates the root $\alpha^{-k}$ of an initial error locator polynomial from input erasure locator information and a control signal (CON) showing that $\alpha^{-k}$ is a root with respect to new erasure information, a first polynomial expander 206 expands an initial error locator polynomial ($\lceil(x)$) by a serial expansion method using $\alpha^{-k}$ and the control signal (CON) output from the $\alpha^{-k}$ generator 202.

A first polynomial calculator 204 calculates syndrome values of data received using a syndrome polynomial (S(x)). The syndrome which is essential to the decoding of a packet code is defined in Equation 1.

$$S_k = S(\alpha^k) = \gamma(\alpha^k), k=0, 1, \ldots, 2t-1 \qquad [\text{EQUATION 1}]$$

wherein, when an error is not generated, "0" is obtained by substituting $\alpha^{-k}$ for the syndrome polynomial (S(x)) and substituting $\alpha^{-k}$ for a parity polynomial (r(x)).

Figure 1:
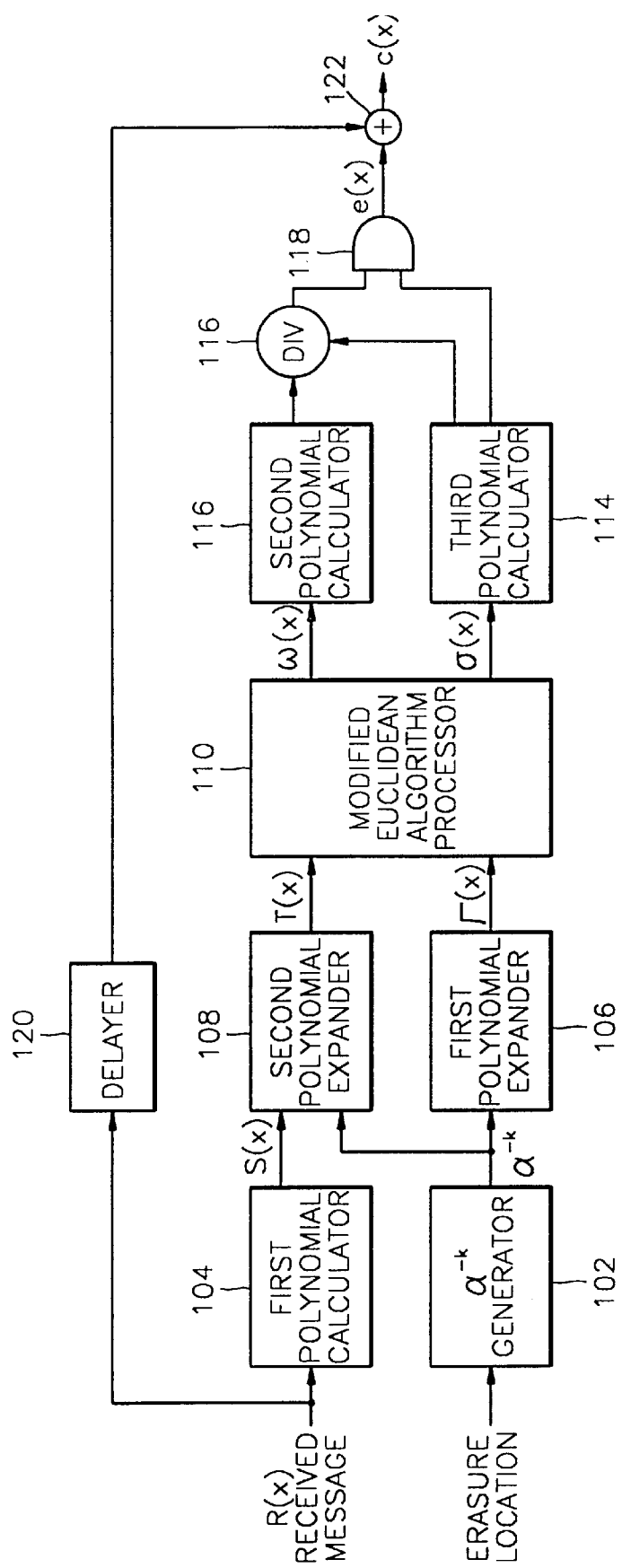
FIG. 1 is a block diagram of a conventional RS decoder.
Figure 2:
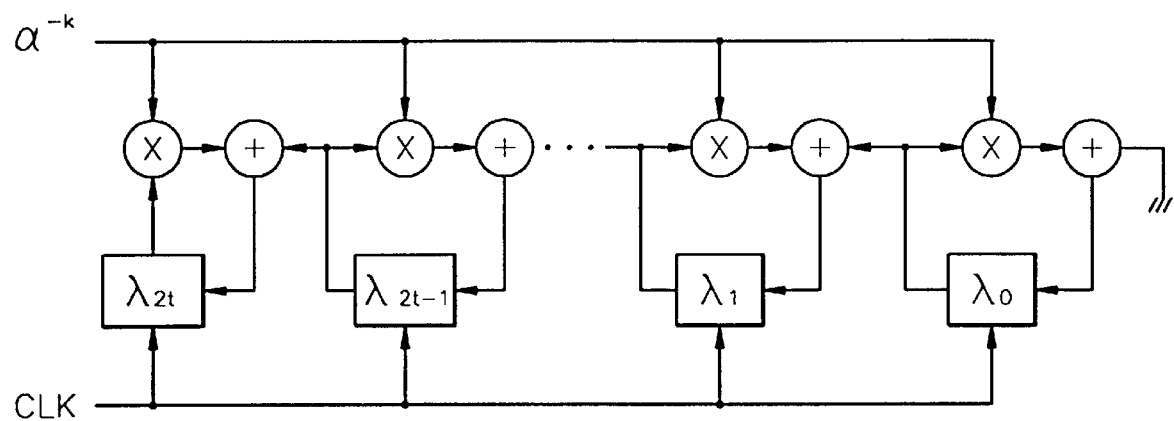
FIG. 2 is a circuit diagram of a first polynomial expander shown in FIG. 1 having a conventional parallel expansion architecture.
Figure 3:
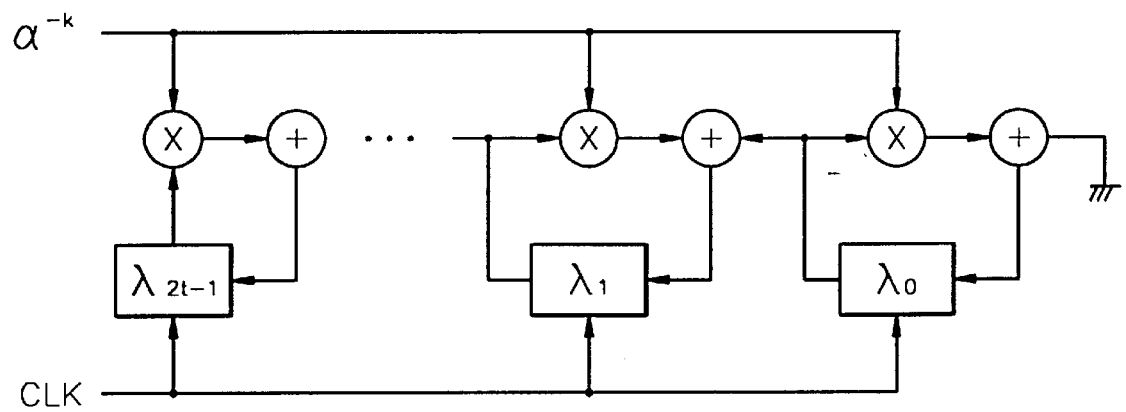
FIG. 3 is a circuit diagram of a second polynomial expander shown in FIG. 1 having conventional parallel expansion architecture.

When v errors are generated as shown in FIG. 2, the syndrome values can be calculated using only an error polynomial by Equation 3.

$$e(x) = e_0 x^{j0} + e_1 x^{j1} + \ldots + e_v x^{jv} \qquad [\text{EQUATION 2}]$$

$$S_K = S(\alpha^k) = \gamma(\alpha^k) = c(\alpha^k) + e(\alpha^k) = e(\alpha^k) \qquad [\text{EQUATION 3}]$$

In general, the most widely used method among methods for searching the location and size of an error using the calculated syndrome values is using the modified Euclidean algorithm. Since the modified Euclidean algorithm applied to a modified Euclidean algorithm processor 210 of the present invention is provided in the document [1], a detailed description thereof will be omitted. In order to perform decoding using the modified Euclidean algorithm, the calculated syndrome values must be expressed as the coefficients of the polynomial. Equation 4 is a syndrome polynomial of 2t−1 degrees, having the syndrome values as coefficients.

$$S(X) = S_0 + S_1 X + S_2 X^2 + \ldots + S_{2t-1} X^{2t-1} \qquad [\text{EQUATION 4}]$$

A second polynomial expander 208 solves a key equation represented by Equation 5 using the syndrome polynomial (S(x)) calculated by the first polynomial calculator 204, $\alpha^{-k}$ output from the $\alpha^{-k}$ generator 202, and the control signal (CON) and expands a modified syndrome polynomial (T(x)).

$$T(x) = S(x) \times \lceil(x) \mod x^{2t} \qquad [\text{EQUATION 5}]$$

wherein, S(x) and $\lceil(x)$ respectively represent a syndrome polynomial and an initial error locator polynomial. At this time, the initial error locator polynomial $\lceil(x)$ is expanded by the first polynomial expander 206 using $\alpha^{-k}$ and the control signal (CON) generated by the a generator 202. Since $\lceil(x)$ is represented by Equation 6 with respect to $\alpha^{-k}$ calculated by the input erasure locator information, the modified syndrome polynomial is obtained by repeating the operation such as Equation 7 in every input erasure locator information.

$$\lceil(x) = \pi(x - \alpha^{-k}) \qquad [\text{EQUATION 6}]$$

wherein, π represents a multiplication. The root of the initial error locator polynomial $\lceil(x)$ shows the location where an error is generated. Namely, if $\alpha^{-k}$ is the root, it means that the error is generated in the (k+1)th code word among received code words. In the (k+1)th code word, a code index corresponds to k.

$$\text{iterative equation: } S(x)(x-\alpha^{-k}) = xS(x) - \alpha^{-k}S(x) \qquad [\text{EQUATION 7}]$$

Second and third polynomial calculators 212 and 214 calculate an error evaluator polynomial ω(x) and an error locator polynomial σ(x) and apply them to a divider 216. The divider 216 calculates the error size by Equation 8 with respect to $\alpha^{-k}$.

$$\hat{e}_k = -\frac{\omega(\alpha^{-k})}{\sigma'(\alpha^{-k})} \qquad [\text{EQUATION 8}]$$

An AND gate 218 makes only the output of the divider 216 corresponding to the root of the error locator polynomial (σ(x)) calculated by the third polynomial calculator 214 selected. An adder 222 is comprised of an exclusive-OR gate for performing an exclusive-OR operation on the received data delayed by a delay 220 and the size of the error output from the AND gate 218. The data decoded is output from the adder 222. At this time, (c(x)) represents a modified data polynomial.

Figure 5:
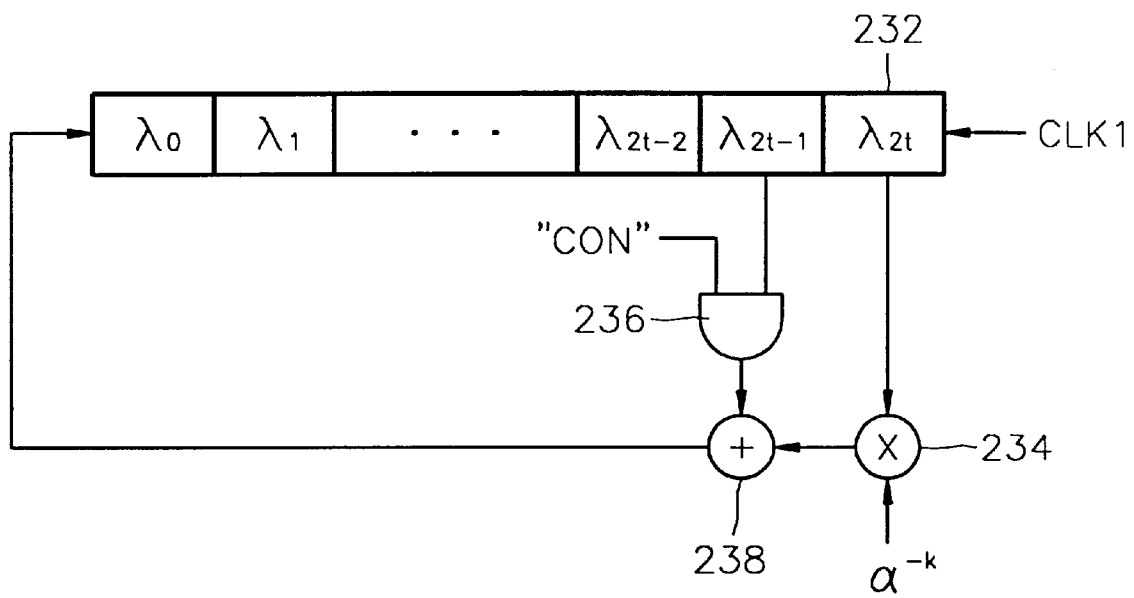
FIG. 5 is a circuit diagram of a first polynomial expander shown in FIG. 4 having a serial expansion architecture provided by the present invention.
Figure 6:
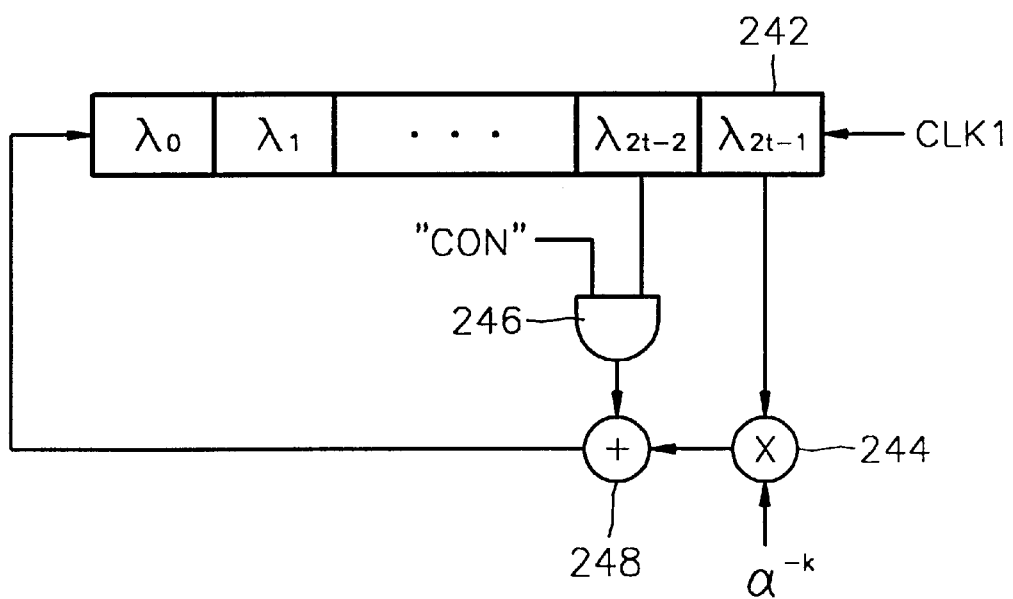
FIG. 6 is a circuit diagram of a second polynomial expander shown in FIG. 4 having the serial expansion architecture provided by the present invention.

In calculating the polynomial of the RS decoder using the modified Euclidean algorithm provided by the present invention, the circuit diagram of the first polynomial expander 206 realized using the serial expansion method is shown in FIG. 5. The circuit diagram of the second polynomial expander 208 is shown in FIG. 6.

When the number of errors capable of being corrected is t, the first polynomial expander 206 for obtaining the initial error locator polynomial includes a shift register 232 for storing 2t+1 coefficients, single multiplier 234, an adder 238, and a logic circuit (an AND gate 236) as shown in FIG. 5. The second polynomial expander 208 for obtaining the modified syndrome polynomial includes a shift register 242 for storing 2t coefficients, a multiplier 244, an adder 248, and an AND gate 246 as shown in FIG. 6.

The initial value of the shift register 232 of the first polynomial expander shown in FIG. 5 initializes the least significant coefficient $\lambda_0$ as "1" and sets the reset coefficients as "0". The adder 238 and the multiplier 234 are operators in the Galois Field. The multiplier 234 has an architecture of a one step pipeline so that a high speed operation can be performed. The adder 238 includes an exclusive-OR gate. The AND gate 236 is used since the least significant degree operation of the initial error locator polynomial is different from an upper degree operation.

Namely, since when a new $\alpha^{-k}$ value is input, one iterative calculation is completed and the next iterative calculation resumes, in the serial expansion method, when $\alpha^{-k}$ with respect to new error information is input, a calculation such as Equation 10 must first be performed instead of the calculation of Equation 9. The operation such as Equation 9 is iteratively performed before $\alpha^{-k}$ with respect to the next new erasure information is input.

$$\hat{S}_i = S_i \alpha^{-k} + S_{i-1} \quad i=1, 2, \ldots, 2t \quad \text{[EQUATION 9]}$$

$$\hat{S}_i = S_i \alpha^{-k} \quad i=0 \quad \text{[EQUATION 10]}$$

wherein, the control signal (CON) showing that a new $\alpha^{-k}$ value is input is generated by the $\alpha^{-k}$ generator 202 shown in FIG. 4 for storing the $\alpha^{-k}$ values and outputting them one by one. The initial error locator generator 202 generates the control signal (CON) of logic "low" during one clock cycle where $\alpha^{-k}$ is maintained for a certain time, the $\alpha^{-k}$ value with respect to the next erasure information is sent, and it is shown that the $\alpha^{-k}$ value is new ask. The first polynomial expander 206 starts the serial expansion on new $\alpha^{-k}$ using the control signal (CON) of the logic "low".

Namely, the multiplier 234 multiplies the coefficient stored in the shift register 232 with the input $\alpha^{-k}$. The adder 238 adds the output of the multiplier 234 to the previous coefficient output through the AND gate 236 as shown in Equation 9 when the control signal (CON) is at logic "high" and passes the output of the multiplier 234 as shown in the Equation 10 when the control signal (CON) is at logic "low" since $\alpha^{-k}$ is a root with respect to new erasure information. The output of the multiplier 234 is fed back to the shift register 232.

When all the $\alpha^{-k}$ values stored in the $\alpha^{-k}$ generator 202 shown in FIG. 4 are expanded, the initial error locator polynomial $\alpha^{-k} \lceil (x)$ is obtained. The $\alpha^{-k}$ generator 202 fills remaining information with "0" when the number of the stored $\alpha^{-k}$ values is less than 2t. Therefore, when "0" is input to the first polynomial expander 206, the values of the storing elements of the shift register 232 are not changed.

The basic concept of a process of making a modified syndrome polynomial from the syndrome polynomial calculated from the first polynomial calculator 204 shown in FIG. 4 by the detailed circuit of the second polynomial expander shown in FIG. 6 is the same as that of a process of calculating the initial error locator polynomial described in FIG. 5. Namely, when the initial values of the respective storing elements of the shift register 242 as shown in FIG. 6 are filled with the syndrome values calculated by the first polynomial calculator 204, the coefficients of the modified syndrome polynomial can be obtained.

When the serial expansion method is used in the first and second polynomial expanders 206 and 208, the multiplier can be reduced to one in each expander regardless of the number of being capable of correcting errors. Meanwhile, 2t clock time is required in order to complete the multiplication on specific $\alpha^{-k}$.

Therefore, a processing time required in the first and second polynomial expanders 106 and 108 using the conventional parallel expansion method is only 2t clock time. Meanwhile, a latency which is a calculation delay time increases in the first and second polynomial expanders 206 and 208 of the present invention. Namely, the calculation delay time in the first polynomial expander 206 is 2t*(2t+1). The calculation delay time in the second polynomial expander 208 is 2t*2t when an iterative equation is performed on maximum 2t syndromes. Such a latency can be compensated for by using a fast clock.

Namely, in order to correct errors without colliding with continuously input RS packets, expansion must be performed using all the previously stored $\alpha^{-k}$ s before syndromes of the next packet is calculated. When the length of the codeword of the RS packet is N, the frequency of the clock CLK1 used by the first and second polynomial expanders 206 and 208 must be increased $(2t)^2/N$ times than a symbol frequency in order to perform a polynomial calculation without collision between adjacent packets. This value of times differs according to the given RS code, i.e., around 2 through 4. In order to perform multiplication in such a frequency, the multiplier used in the present invention is one step pipelined.

The number of multipliers and the processing time of the first and second polynomial expanders 206 and 208 having the serial architecture provided in the present invention are shown in Table 1.

TABLE 1

|  | Conventional architecture | Architecture according to the present invention |
| --- | --- | --- |
| Number of multipliers | 4t+1 | 2 |
| Processing time | 2t+2t | (2t)2 + (2t +1 ) * (2t) |

According to the present invention, a very large scale integration (VLSI) circuit structure of an RS decoder is greatly simplified by minimizing the number of multipliers required for calculating a polynomial in an RS decoder using a modified Euclidean algorithm. Accordingly, expenses are reduced.

What is claimed is:

1. A Reed-Solomon (RS) decoder including a modified Euclidean algorithm processor for determining a location and a size of an error based on syndrome values, comprising:

a polynomial calculator for calculating syndrome values from received data and constructing a syndrome polynomial;

a generator for generating a root of an initial error locator polynomial from erasure information of the received data, and a control signal indicating a new root for the initial error locator polynomial when new erasure information is input;

a first polynomial expander having a serial expansion architecture, for expanding the initial error locator polynomial using the root of the initial error locator polynomial and the control signal for the initial error locator polynomial and providing the result to the modified Euclidean algorithm processor; and a second polynomial expander having a serial expansion architecture, for expanding a modified syndrome polynomial using the syndrome values, the root of the initial error locator polynomial and the control signal indicating a new root for the initial error locator polynomial, and providing the result to the modified Euclidean algorithm processor.

2. The RS decoder of claim 1, wherein the first polynomial expander comprises:

a first shift register for storing 2t+1 coefficients in accordance with a clock signal, wherein t is the number of errors capable of being corrected;

a first multiplier for multiplying an output of the first shift register by the root for the initial error locator polynomial;

a first logic circuit for outputting a previous coefficient stored in the first shift register in accordance with the control signal indicating the new root for the initial error locator polynomial for new erasure information; and a first adder for adding the output of the first logic circuit to the output of the first multiplier and feeding the result back to the first shift register.

3. The RS decoder of claim 2, wherein the first multiplier has a one step pipeline architecture.

4. The RS decoder of claim 2, wherein the received data is a packet comprising N symbols and, when the number errors capable of being corrected is t, the frequency of the clock signal is increase $(2t)^2/N$ times a symbol frequency.

5. The RS decoder of claim 2, wherein the first logic circuit comprises an AND gate for performing an logical AND operation on the coefficient stored in the first shift register and the control signal, and the first adder comprises an exclusive-OR gate.

6. The RS decoder of claim 2, wherein the least significant coefficient is set to be "1" and the remaining coefficients are set to be "0" in the initial value of the first shift register.

7. The RS decoder of claim 1, wherein the second polynomial expander comprises:
- a second shift register for storing 2t coefficients according to a clock signal;
- a second multiplier for multiplying an output stored in the second shift register by the root for the initial error locator polynomial;
- a second logic circuit for outputting the previous coefficient stored in the second shift register according to the control signal indicating the new root of the initial error locator polynomial on the new erasure information; and
- a second adder for adding an output of the second logic circuit to an output of the second multiplier and feeding the result back to the second shift register.

8. The RS decoder of claim 7, wherein the second multiplier has a one step pipeline architecture.

9. The RS decoder of claim 7, wherein the received data is a packet comprising N symbols and, when the number of errors capable of being corrected is t, the frequency of the clock signal is increased $(2t)^2/N$ times the symbol frequency.

10. The RS decoder of claim 7, wherein the second logic circuit comprises an AND gate for performing an logical AND operation previous coefficient output from the second shift register and the control signal, and the second adder comprises an exclusive OR gate.

11. The RS decoder of claim 7, wherein the initial value of the second shift register is set to be the syndrome values calculated by the polynomial calculator.

12. An Reed-Solomon (RS) decoding method using a modified Euclidean algorithm, comprising the steps of:
- (a) calculating syndrome values from received data;
- (b) generating a root for an initial error locator polynomial from erasure information of the received data and a control signal indicating a new root for the initial error locator polynomial with respect to new erasure information;
- (c) expanding an initial error locator polynomial in accordance with the root for the initial error locator polynomial and the control signal;
- (d) expanding a modified syndrome polynomial based on the syndrome values, the root for the initial error locator polynomial, and the control signal; and
- (e) calculating a location and a size of an error included in the received data by applying the modified Euclidean algorithm to the expanded initial error locator polynomial and the expanded modified syndrome polynomial.

13. The method of claim 12, wherein the step (c) comprises the steps of:
- (c1) reading coefficients from a first shift register which stores 2t+1 coefficients, wherein t is a number of errors capable of being corrected, and multiplying the read coefficients by the root for the initial error locator polynomial; and
- (c2) feeding back to the first shift register a multiplication result obtained by multiplying a least significant coefficient with the root for the initial error locator polynomial and a result obtained by adding the multiplication result to a previous coefficient.

14. The method of claim 13, wherein the least significant coefficient is set to be "1" and the remaining coefficients are set to be "0" in the initialized value of the first shift register.

15. The method of claim 12, wherein the step (d) comprises the steps of:
- (d1) reading coefficients from a second shift register which stores 2t coefficients, and multiplying the read coefficients with the root for the initial error locator polynomial; and
- (d2) feeding back to the second shift register a multiplication result obtained by multiplying the least significant coefficient with the root for the initial error locator polynomial and a result obtained by adding the multiplication result to a previous coefficient.

16. The method of claim 15, wherein the initial value of the second shift register is set to be the syndrome values calculated in the step (a).

* * * * *